United States Patent
Yook et al.

(10) Patent No.: US 9,059,110 B2
(45) Date of Patent: Jun. 16, 2015

(54) REDUCTION OF FLUORINE CONTAMINATION OF BOND PADS OF SEMICONDUCTOR DEVICES

(75) Inventors: Hyung Sun Yook, Sarawak (MY); Tsui Ping Chu, Sarawak (MY); Poh Ching Sim, Sarawak (MY)

(73) Assignee: X-Fab Semiconductor Foundries AG, Erfurt (DE)

( * ) Notice: Subject to any disclaimer, the term of this patent is extended or adjusted under 35 U.S.C. 154(b) by 199 days.

(21) Appl. No.: 13/394,238

(22) PCT Filed: Sep. 4, 2009

(86) PCT No.: PCT/IB2009/053877
§ 371 (c)(1),
(2), (4) Date: Jun. 1, 2012

(87) PCT Pub. No.: WO2011/027193
PCT Pub. Date: Mar. 10, 2011

(65) Prior Publication Data
US 2012/0241914 A1    Sep. 27, 2012

(51) Int. Cl.
  *H01L 23/52*  (2006.01)
  *H01L 23/31*  (2006.01)
  *H01L 23/00*  (2006.01)

(52) U.S. Cl.
  CPC .... *H01L 23/3178* (2013.01); *H01L 2224/05624* (2013.01); *H01L 2224/85013* (2013.01); *H01L 2924/01005* (2013.01); *H01L 2924/01013* (2013.01); *H01L 2924/01014* (2013.01); *H01L 2924/01015* (2013.01); *H01L 2924/01022* (2013.01); *H01L 2924/01029* (2013.01); *H01L 2924/01073* (2013.01); *H01L 2924/01074* (2013.01); *H01L 2924/01327* (2013.01); *H01L 2924/04941* (2013.01); *H01L 2924/04953* (2013.01); *H01L 2924/05042* (2013.01); *H01L 2924/14* (2013.01); *H01L 2924/19041* (2013.01); *H01L 24/05* (2013.01); *H01L 2924/01033* (2013.01)

(58) Field of Classification Search
  USPC ............................ 257/462, 620, 758; 438/462
  See application file for complete search history.

(56) References Cited

U.S. PATENT DOCUMENTS

| 7,056,811 | B2 | 6/2006 | Sasaki et al. |
| 7,223,673 | B2 | 5/2007 | Wang et al. |
| 7,482,251 | B1 | 1/2009 | Paulsen et al. |
| 7,939,913 | B2 * | 5/2011 | Watanabe et al. ............. 257/620 |
| 2005/0116333 | A1 * | 6/2005 | Akiyama ..................... 257/698 |
| 2006/0068567 | A1 | 3/2006 | Beyne et al. |
| 2009/0155982 | A1 | 6/2009 | Wakisaka et al. |

FOREIGN PATENT DOCUMENTS

| CN | 101 459 055 A | 6/2009 |
| WO | WO 2008126268 A1 * | 10/2008 |

* cited by examiner

*Primary Examiner* — Jose R Diaz
(74) *Attorney, Agent, or Firm* — Laurence A. Greenberg; Werner H. Stemer; Ralph E. Locher

(57) ABSTRACT

A method of reducing contamination of contact pads in a metallization system of a semiconductor device. Fluorine contamination of contact pads in a semiconductor device can be reduced by appropriately covering the sidewall portions of a metallization system in the scribe lane in order to significantly reduce or suppress the out diffusion of fluorine species, which may react with the exposed surface areas of the contact pads. The quality of the bond contacts is enhanced, possibly without requiring any modifications in terms of design rules and electrical specifications.

7 Claims, 11 Drawing Sheets

US 9,059,110 B2

REDUCTION OF FLUORINE CONTAMINATION OF BOND PADS OF SEMICONDUCTOR DEVICES

FIELD OF THE INVENTION

The present invention generally relates to semiconductor devices comprising metallization systems in which fluorine doped interlayer dielectric materials are used in order to enhance performance of the metallization system in terms of reduced RC (resistance capacitance) times.

DESCRIPTION OF THE RELATED ART

Integrated circuits include typically a plurality of circuit elements that are formed in and above an appropriate semiconductor layer, such as a silicon layer or any other appropriate semiconductor material. Due to the ongoing shrinkage of critical dimensions of the individual circuit elements, the overall packing density has been continuously increased, thereby providing the possibility to also increase functionality of the integrated circuits. Due to the continuous shrinkage of the feature sizes of the circuit elements an increased packing density is used in integrated circuits, thereby also requiring an increased number of interconnections between the individual circuit elements, such as transistors, capacitors, resistors and the like. Typically, the required number of electrical connections between the circuit elements, which are usually formed in and above a semiconductor layer, such as a silicon layer, may not be provided in the same device level as the circuit elements, thereby requiring an appropriate wiring system, which is also referred to herein as a metallization system. In a metallization system one or more metallization layers are provided, in which metal lines are formed on the basis of appropriate metals, such as aluminium, in order to provide the current paths within a specific metallization layer. Furthermore, a metallization layer is connected to a neighbouring metallization layer or to the device layer, i.e., to the circuit elements, by "vertical" contacts, also referred to as vias, which interconnect the various metallization levels in order to obtain the complex wiring network of the metallization system. Consequently, the final electrical performance of a complex integrated circuit not only depends on the characteristics of the circuit elements, such as the transistors and the like, but is also influenced by the electrical performance of the metallization system. In an attempt to continuously increase the packing density of integrated circuits, also the feature sizes of the metal lines and vias have to be reduced, which on the other hand, may result in an increased series resistance of the metal lines and vias due to the reduced dimensions, while also the reduced spacing between adjacent metal lines may contribute to increased RC (resistance capacitance) times due to parasitic capacitive coupling between closely spaced metal lines. As a consequence, the interlayer dielectric material, i.e., the dielectric material of the metallization layers, which separates the individual metal regions embedded therein, is frequently provided in the form of a material having a reduced dielectric constant compared to well-established dielectric materials, such as silicon dioxide, silicon nitride, and the like. For this purpose, frequently fluorine doped silicon oxide based materials, also known as fluorine doped silicate glass (FSG) is used as an interlayer dielectric material, thereby significantly reducing the overall permittivity and the thus the signal propagation delay in the metallization system.

The overall manufacturing flow for fabricating integrated circuits is typically performed in complex semiconductor facilities, in which a plurality of very complex manufacturing processes are carried out on the basis of appropriate wafers or substrates, which typically comprise a plurality of die or semiconductor chips, which have to be separated in a very advanced manufacturing state. Frequently, the dicing or separation of the semiconductor wafers is performed in separate manufacturing facilities, while most of the preceding manufacturing processes are carried out on a wafer basis. One of the final manufacturing processes accomplished on a wafer basis is the provision of contact pads, for instance in the form of bond pads, which represent metal regions in the last metallization layer and serve as an "interface" between the semiconductor chip and a package, the electrical terminals thereof, for instance provided as pins, and the like, thereby enabling the semiconductor chip to communicate with the periphery. Irrespective of the technology used for contacting the contact pads, the electrical performance and the reliability of the resulting contacts may strongly depend on the quality of the surface of the contact pads, since, for instance, typical techniques for connecting a bond wire rely on well-defined and predictable surface conditions of the bond pads. However, increasingly contact deterioration or even severe contact failures have been observed in semiconductor chips, as will be described in more detail with reference to FIGS. 1 to 3.

FIG. 1 schematically illustrates a top view of a semiconductor device 1 comprising a plurality of die regions or chip regions 2a, . . . , 2d, which are separated by scribe lanes 3. The semiconductor chips 2a, . . . , 2d thus represent rectangular device regions formed in and above a substrate, such as a semiconductor material and the like, which comprise circuit elements, transistors, capacitors, resistors, and the like, as required for the one or more electronic circuits included in each of the semiconductor chips 2a, . . . , 2d. Furthermore, the semiconductor chips 2a, . . . , 2d comprise a metallization system that provides for the electrical connections in order to obtain the desired overall circuit function. On the other hand, the scribe lanes 3 represent areas, along which the device 1 will be separated into the individual semiconductor chips 2a, . . . , 2d on the basis of any appropriate technique, such as sawing, laser dicing, and the like. It should be appreciated, however, that the scribe lanes 3 may also include, at least locally, circuit elements and even more or less functional circuit portions, such as test areas and the like, which, however, may be destroyed upon separating the device 1.

FIG. 2 schematically illustrates a cross-sectional view of a portion of the semiconductor device 1. As illustrated, the device 1 comprises a substrate or a wafer 4, which includes any appropriate semiconductor material, such as silicon and the like, in and above which circuit elements 12, such as transistors, capacitors, and the like are formed. Furthermore, the device 1 comprises a metallization system 5, which contains a required number of metallization layers 5a, . . . 5f, depending on the complexity of the wiring system required for interconnecting the circuit elements 12. Each of the metallization layers 5a, . . . , 5f comprises metal lines 6 and vias 7 that are formed of an appropriate metal. In the example shown, the metal lines 6 are comprised of aluminium possibly in combination with copper in order to form an aluminium/copper alloy, while the vias 7 are comprised of tungsten possibly in combination with an appropriate conductive barrier material (not shown), such as titanium nitride, titanium, and the like. The metal lines 6 and the vias 7 are embedded in a dielectric material, such as a silicon oxide based material, wherein, as previously explained, at least some of the metallization layers 5a, . . . , 5f have a reduced dielectric constant due to the incorporation of a fluorine species. The metallization system 5 includes a final or least metallization layer 5f, in which a plurality of contact pads 8 is provided, which represent contact areas for receiving bond wires in a later manufacturing stage. Moreover, a passivation layer 10, which is typically comprised of a plurality of materials, such as silicon nitride, followed by silicon oxide and a silicon oxynitride material, is formed above the final metallization layer 5f. In addition, an etch mask 11, such as a resist mask, is formed above the passivation layer 10 and comprises openings 11a that define the lateral position and size of contact openings to be formed in the passivation layer so as to connect to the contact pads 8. Moreover, the etch mask 11 comprises openings 11b, which typically represent trenches in order to obtain corresponding trenches in the scribe lane 3, thereby removing the dielectric material 9 and "decoupling" the scribe lane 3 from the chip 2a. A corresponding mechanical decoupling is advantages during the process for separating the individual semiconductor chips in order to avoid mechanical stress in the metallization system 5.

The semiconductor device as shown in FIG. 2 may be formed on the basis of any appropriate manufacturing strategy, for instance by forming any circuit elements in and above the substrate 4 and subsequently providing the metallization system 5 by forming appropriate metal layers and patterning the same followed by the deposition of the dielectric material 9, while for the vias 7 the material 9 is formed first and is subsequently patterned to provide via openings, respectively, which are then filled with an appropriate metal. After providing the last metallization layer 5f, which comprises the contact pads 8, the passivation layer 10 is formed by using well-established deposition techniques, followed by the deposition of a resist material and the subsequent patterning thereof in order to obtain the openings 11a, 11b.

FIG. 3 schematically illustrates the semiconductor device 1 in a further advanced manufacturing stage, i.e., after performing an etch process on the basis of the etch mask 11 in order to form openings 10a that connect to contact pads 8 of the metallization system 5, while other trenches 11b of the etch mask 11 extend deeply into the metallization system 5, for instance down to the substrate 4 in order to remove dielectric material from the scribe lane 3, thereby obtaining the desired mechanical decoupling of the chip region 2a during the subsequent processing for separating the individual semiconductor chips. Consequently, during the corresponding etch process the passivation layer 10 is etch selectively to the material of the contact pad 8, while in the scribe lane 3 the etch process further advances down to a desired depth. For this purpose any well-established etch technique based on fluorine etch chemistry is typically applied. Thereafter, the etch mask 11 is removed and appropriate cleaning processes, for instance based on wet chemical recipes, and the like are applied so as to remove any contaminants and etch by-products.

FIG. 4 schematically illustrates a portion of the semiconductor 1, in which contaminants 13 are present on the contact pad 8, which may be created under the influence of a fluorine species used during the previous etch process or which may have been come into contact with the pad 8 during the fabrication of the final metallization layer 5f on the basis of a fluorine doped oxide based material. It should be appreciated that a plurality of fluorine sources may contribute to the generation of the contaminants 13, for instance by reacting with the aluminium and/or the copper species in the contact pad 8. Consequently, in many conventional approaches additional processes, such as a plasma assisted cleaning process 14 and the like are typically applied in an attempt to rework the surface of the contact pad 8 in order to provide for superior process conditions during the subsequent manufacturing processes, for instance to finally contact the pad 8 by a bond wire.

Despite of the additional cleaning process 14, it has been observed that a significant degradation of the surface of the contact pad 8 may occur in particular in combination with moderately long queue times after exposing the contact pads 8 when performing subsequent manufacturing processes, such as contacting the pad 8 by a bond wire and the like.

SUMMARY OF THE INVENTION

In view of the situation set forth above it is an object of the invention to provide superior surface conditions of contact pads in metallization systems formed on the basis of fluorine species.

According to the principles disclosed herein, it has been recognized that the exposure of a fluorine doped dielectric material in metallization systems of semiconductor devices may significantly contribute to surface contamination of exposed contact pads, which is believed to be caused by outdiffusion of the fluorine species from trenches that decouple the individual semiconductor chips in the scribe lanes, in particular if long queue times may occur during the processing of the semiconductor device after exposing the contact pads. Consequently, according to one aspect of the present invention, the above object is solved by a method reducing contamination of contact pads in a metallization system of a semiconductor device. The method comprises forming an opening in a passivation layer of a metallization system so as to expose contact pads of a final metallization layer and forming a trench in a fluorine containing interlayer dielectric material of the metallization system, wherein the trench is positioned in a scribe lane of the semiconductor device. Additionally the method comprises forming a protection layer at least on sidewalls of the trench.

Consequently, by providing the protection layer at least on the sidewalls of the trench in the scribe lane of the semiconductor device the outdiffusion of the fluorine species from the interlayer dielectric material is significantly reduced, irrespective of any queue time requirements during the further processing. Therefore, after exposing the contact pads superior surface conditions thereof, for instance obtained on the basis of any appropriate process strategy, may be maintained throughout the further processing, at least in view of an additional fluorine contamination of the contact pads, as is typically observed in conventional approaches.

In a further embodiment, the step of forming the protection layer at least on sidewalls of the trench comprises the steps of: depositing the protection layer on exposed surface areas of the metallization system and removing the protection layer from at least a portion of the contact pads. Thus, well-established process techniques, such as deposition and etching can efficiently be applied at any appropriate manufacturing stage after exposing the contact pads, for instance prior to performing an efficient cleaning process, thereby not unduly contributing to an increased process complexity.

In a further embodiment the removing of at least a portion of the protection layer from the contact pads comprises the steps of forming an etch mask layer above the protection layer so as to expose portions of the protection layer formed on the contact pads and etching the exposed portions of the protection layer in the presence of the etch mask layer. Hence, by using an additional etch mask the protection layer is efficiently removed from above the contact pads and also from within contact openings formed in the passivation layer, thereby providing for substantially the same device configuration in terms of lateral size of the contact openings compared to conventionally processed semiconductor devices.

According to a further embodiment the removal of the protection layer from at least a portion of the contact pads comprises the step of performing a non-masked anisotropic etch process so as to remove the protection layer from a portion of the contact pads and from a bottom of the trench. In this manner sidewall spacers are formed in the trench, which reliably reduce or suppress the outdiffusion of the fluorine species, without unduly affecting the device geometry above the contact pads due to corresponding sidewall spacers formed in the contact openings. Thus, an efficient diffusion blocking effect is obtained without requiring an additional lithography process.

In a further embodiment the forming of the opening and the trench comprises the steps of forming a etch mask above the passivation layer and performing an etch process in the presence of the etch mask so as to concurrently form the opening and the trench. In this manner a high degree of compatibility to conventional process strategies is achieved, thereby also providing for a degree of compatibility in view of the electrical specifications of the finally obtained semiconductor device, while at the same time enhancing the reliability thereof due to the superior process conditions during the further processing.

In a further embodiment the opening is formed after forming the trench and the protection layer. In this manner undue exposure of the contact pads to etch chemistries is reduced, since in particular the etch process for forming the deep trench in the scribe lane is performed as a separate etch step. For this purpose, in one illustrative embodiment, a first etch mask is formed that defines a lateral size and position of the trench and a first etch process is performed in the presence of the first etch mask in order to form the trench. Thereafter the protection layer is formed and subsequently a second etch mask is provided that defines a lateral size and position of the opening, followed by a second etch process performed in the presence of the second etch mask.

According to another aspect of the present invention the above-described object is solved by a semiconductor device that comprises a metallization system formed above a substrate and containing a plurality of metallization layers and a final metallization layer that includes a contact pad. The semiconductor device further comprises a passivation layer formed above the final passivation layer, which included a contact opening that connects to the contact pad. Additionally the semiconductor device comprises a protection layer formed at least on sidewalls of each of the plurality of metallization layers at a periphery of the metallization system.

Consequently, the protection layer may impart superior reliability to the semiconductor device, since outdiffusion of any unwanted species, such as fluorine, on sidewalls of the metallization system may efficiently be suppressed or at least reduced. The protection layer is in some embodiments also formed on sidewalls of contact openings. In still other embodiments the protection layer is also formed above the passivation layer depending on the process strategy for providing the protection layer. Consequently, the contact pads, for instance provided in the form of bond pads, which may comprise aluminium and copper, have superior contact reliability for instance with respect to bond wire.

Further advantageous embodiments are also described in the dependent claims and in the following detailed description in which reference is also made to the accompanying drawings in which:

BRIEF DESCRIPTION OF THE DRAWINGS

Advantageous embodiments of the invention are described in the following detailed description in which reference is also made to the drawings.

DETAILED DESCRIPTION

Figure 1:
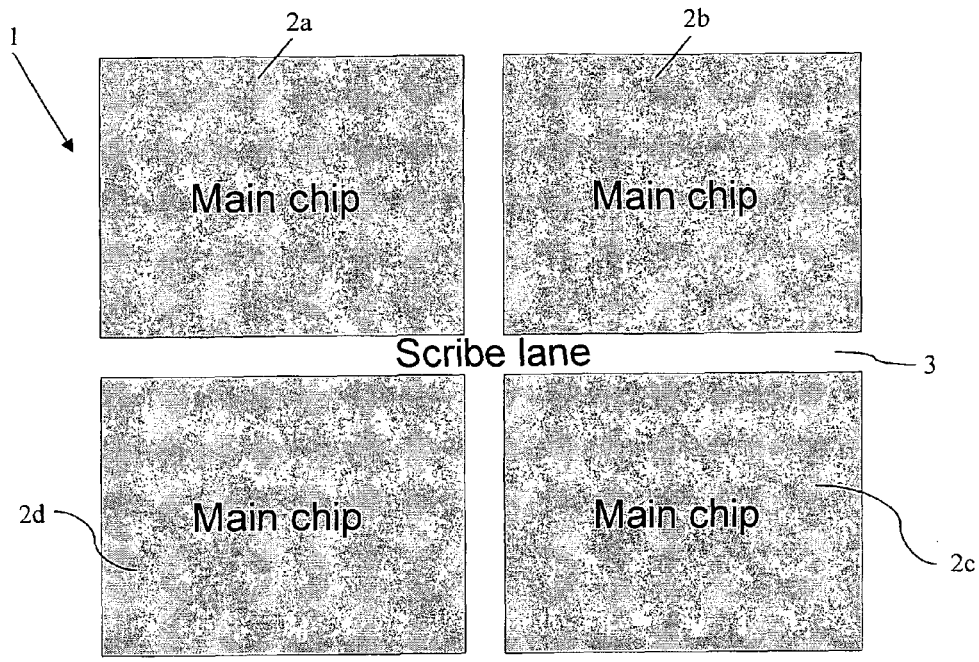
FIGS. 1 to 4 illustrate a conventional semiconductor device during various manufacturing stages in exposing contact pads of a metallization system.
Figure 2:
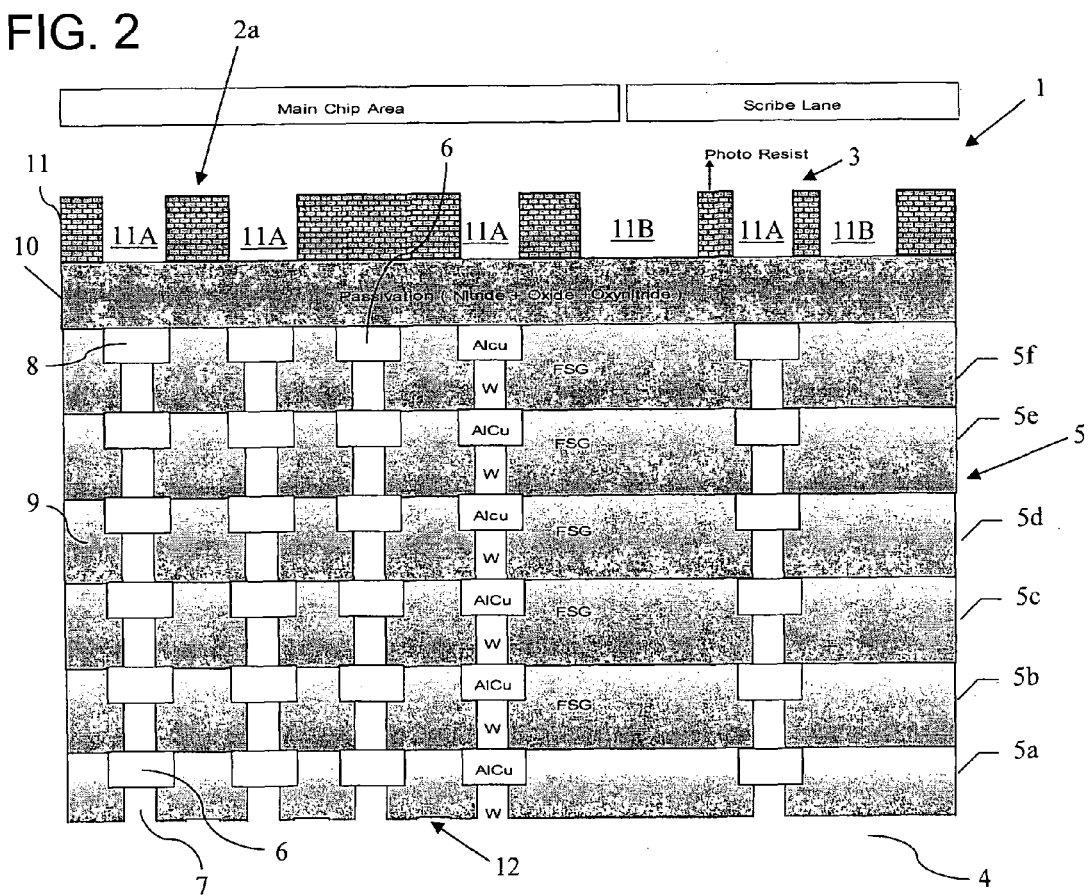

With reference to FIGS. 5 to 16 further embodiments are now described in more detail, wherein the same reference numerals are used throughout the drawings when indicating the same device features or processes. Furthermore, it may also be referred to FIGS. 1 to 4 illustrating conventional process strategies, if appropriate.

Figure 3:
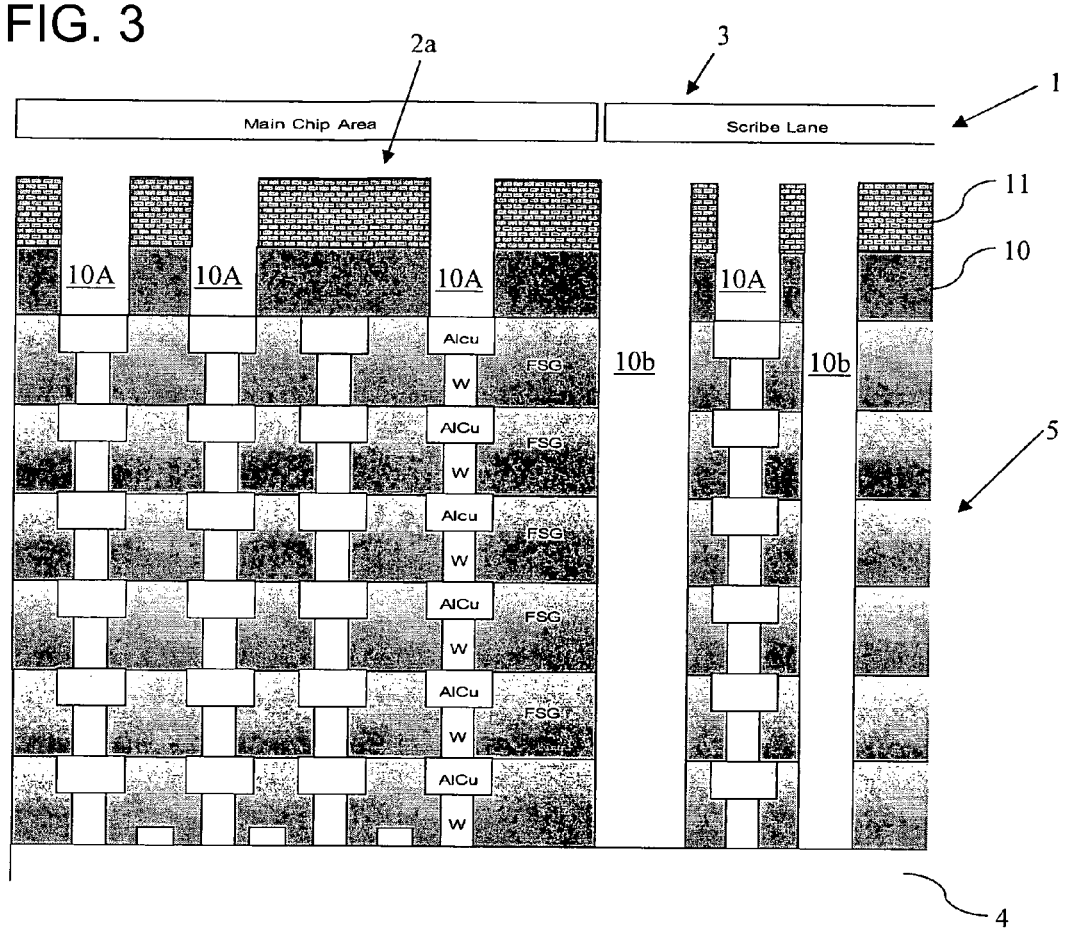
Figure 4:
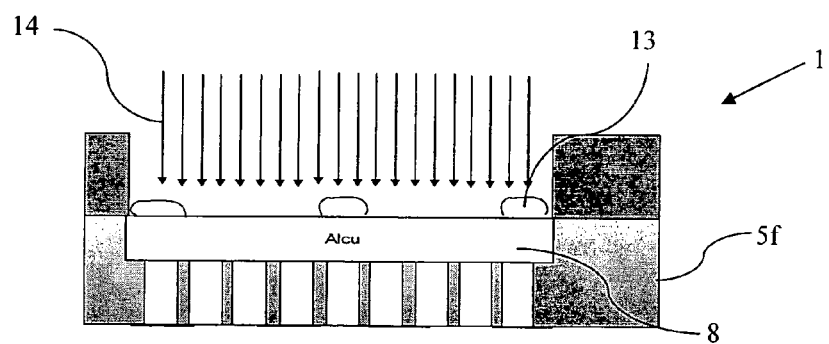
Figure 5:
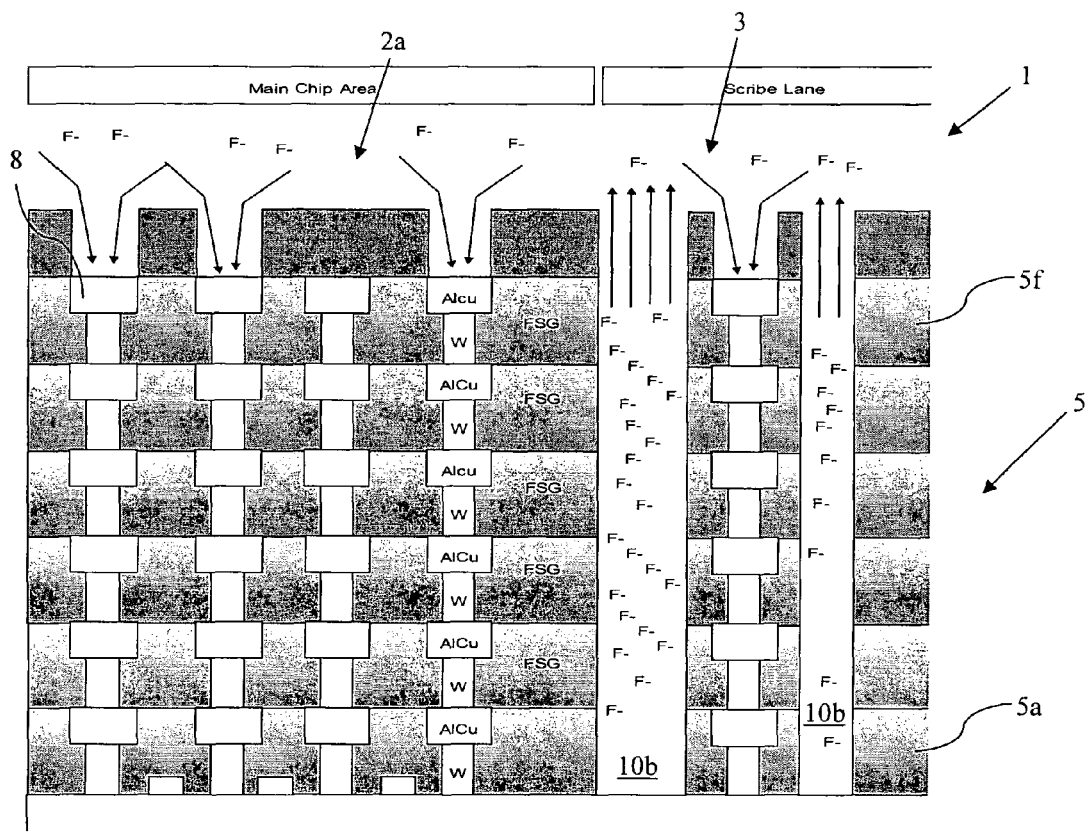
FIG. 5 schematically illustrate a cross-sectional view of a semiconductor device in a manufacturing stage after exposure of the contact pads and prior to separating the semiconductor device into individual semiconductor chips, wherein a mechanism is illustrated that is believed to significantly contribute to inferior contact reliability due to out diffusion of a fluorine species from exposed sidewall portions of a trench in a scribe lane.

FIG. 5 schematically illustrates the semiconductor device 1 in a manufacturing stage similar to the manufacturing stage as described with reference to FIG. 3. That is, the semiconductor device 1 comprises the contact openings 10a and the trenches 10b, for instance after performing an appropriate etch process and cleaning exposed surface areas of the contact pads 8 in order to remove any contaminants, as previously explained. As is well known, in a complex manufacturing facility for forming semiconductor devices, the scheduling of the individual processes may depend on a plurality of factors, some of which may not predictably be controlled, which may thus cause different queue times prior to the further processing of the device 1. In this respect, a queue time is to be understood as a waiting time of substrates prior to performing a subsequent manufacturing step. Typically, the substrates are stored in appropriate storage units, such as stockers and the like, or the semiconductor devices may be transported to a different manufacturing facility, for instance for being diced and the like, as is also previously described. It is believed that a significant out diffusion of fluorine species from the metallization layers 5a, ..., 5f through the large surface area provided by the trenches 10b in the scribe lane 3 may result in a contamination of the exposed contact pads 8, wherein the degree of contamination may increase with an increase of queue time and/or with an increase of exposure to additional environmental influences, such as ambient atmosphere and the like.

Figure 6:
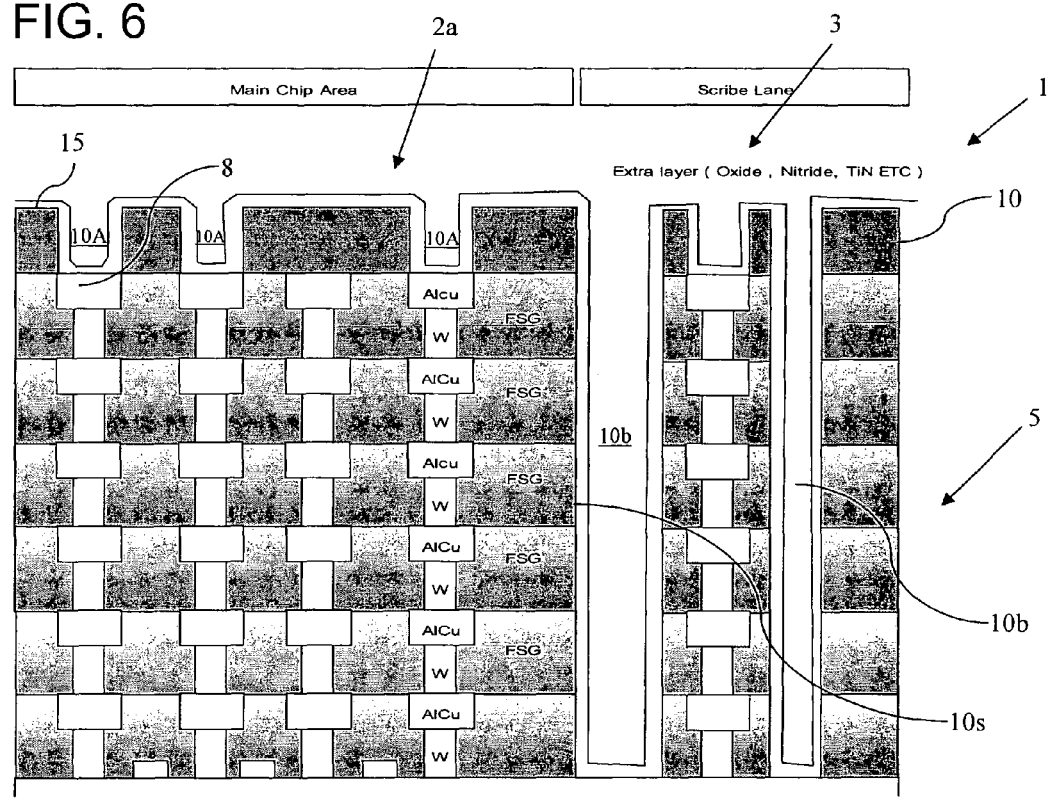
FIGS. 6 to 9 schematically illustrate cross-sectional views of a semiconductor device during several process stages in reducing contamination of exposed contact pads by forming a protection layer according to illustrative embodiments.

FIG. 6 schematically illustrates the semiconductor device 1 according to one illustrative embodiment in which the contact openings 10a are formed in the passivation layer 10 and the trenches 10b are formed so as to extend through the metallization system 5 within the scribe lane 3. With respect to any manufacturing strategy for forming the contact openings 10a and the trenches 10b, it is referred to the process techniques as described above. In the embodiment shown the device 1 further comprises a protection layer 15, which may be comprised of any appropriate material, such as silicon oxide-based materials in the form of silicon dioxide, silicon oxynitride and the like, silicon nitride, other materials which may frequently be used as barrier materials, such as titanium nitride, tantalum nitride and the like.

Consequently, the protection layer 15 is formed in the contact openings 10a and also in the trenches 10b, thereby also reliably covering sidewalls 5s of the trenches 10b. The protection layer 15 may be formed on the basis of any appropriate deposition technique, such as CVD (chemical vapour deposition) using a plasma assisted process ambient, PVD (physical vapour deposition), for instance in the form of sputter deposition and the like. Consequently, after patterning the passivation layer 10 and after performing any appropriate cleaning processes, if required in this manufacturing stage, the layer 15 is deposited with a thickness in the range of 10 nm to several hundred nanometers, such as 600 nm, depending on the overall device geometry.

Figure 7:
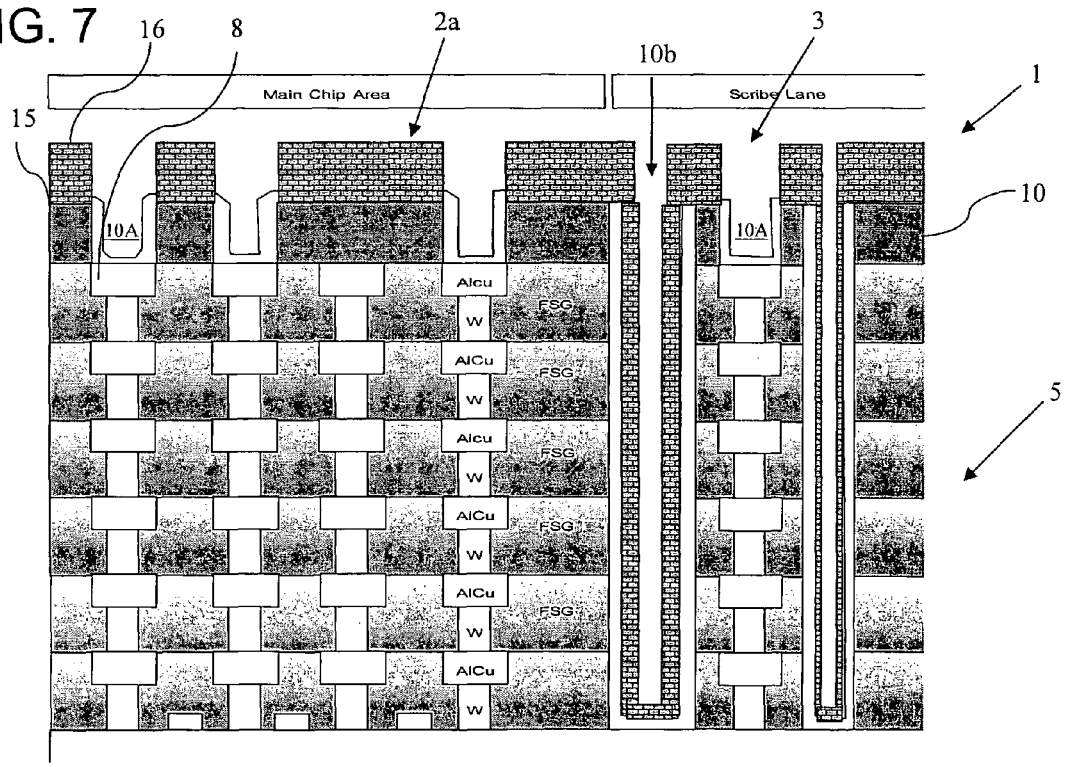

FIG. 7 schematically illustrates the semiconductor device 1 in a further advanced manufacturing stage in which an etch mask 16, such as a resist mask, is formed so as to expose portions of the protection layer 15 formed in the contact openings 10a while covering portions of the protection layer 15 formed in the trenches 10b and on the passivation layer 10 outside of the contact openings 10a. For this purpose, an appropriate lithography mask is used in combination with well-established lithography techniques.

Figure 8:
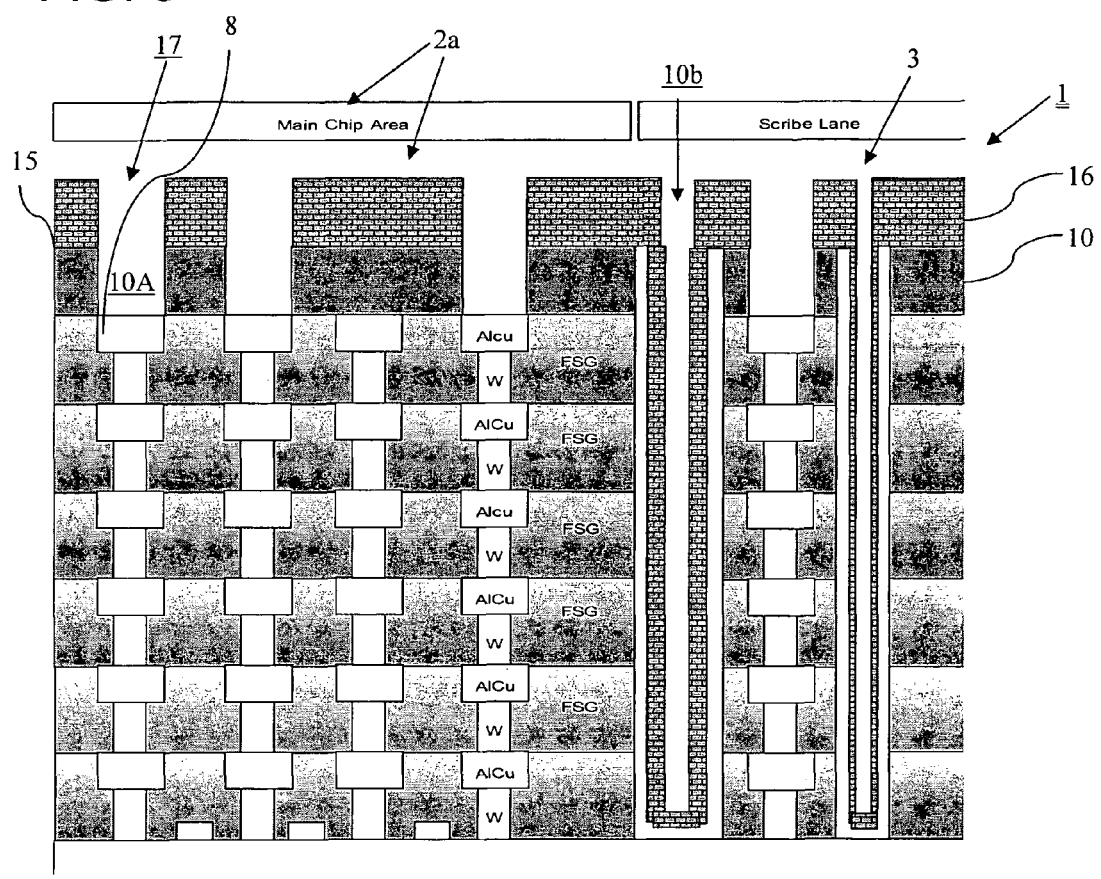

FIG. 8 schematically illustrates the semiconductor device 1 when exposed to an etch process 17, in which exposed portions of the protection layer 15 are removed selectively to the etch mask 16 and selectively to the passivation layer 10 and the contact pads 8. For this purpose, a plurality of well-established wet chemical etch recipes, isotropic plasma assisted etch recipes and the like are available and may be applied, depending on the material composition of the protection layer 15. For instance, silicon nitride may selectively be removed to silicon oxide-based materials by using hot phosphoric acid and the like, while in other cases a plurality of plasma-based etch recipes are available in order to provide a selective etch ambient.

Figure 9:
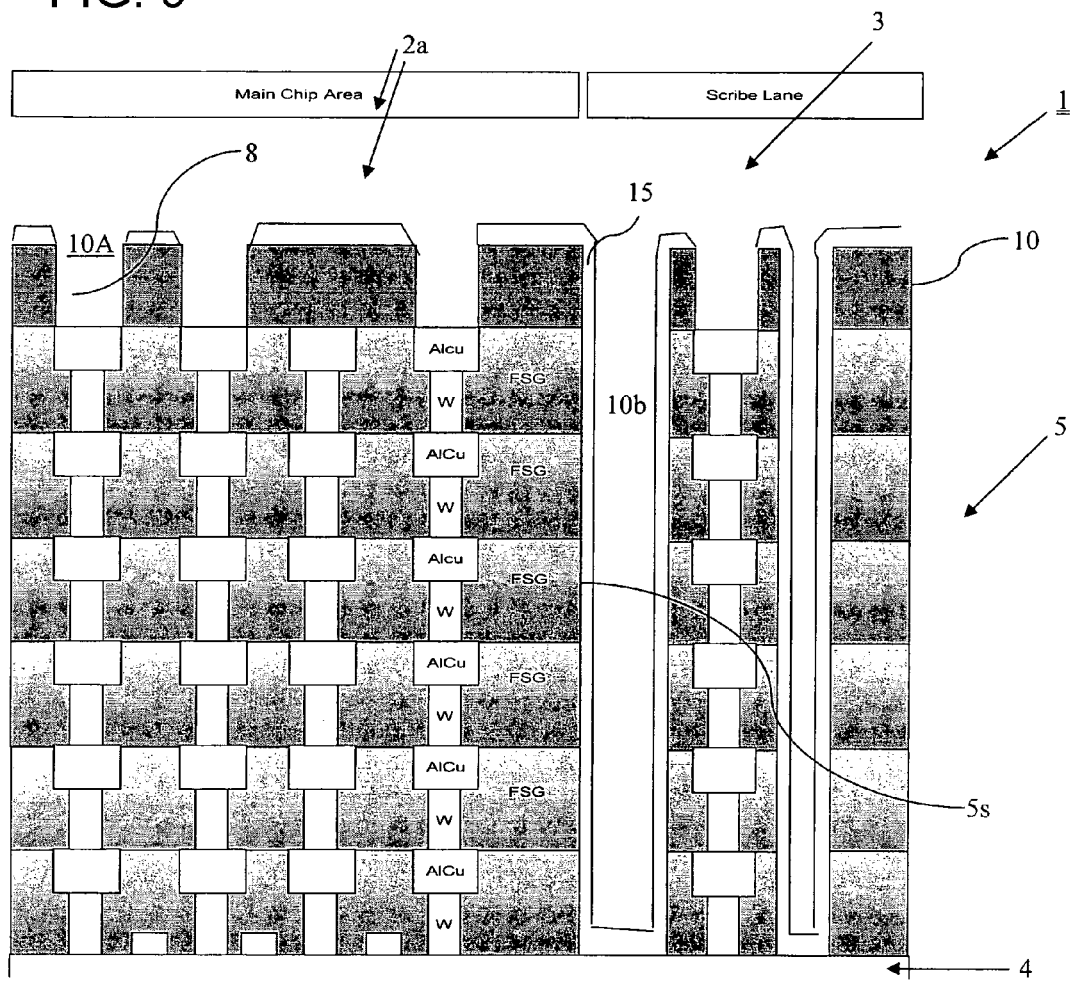

FIG. 9 schematically illustrates the semiconductor device 1 in a further advanced manufacturing stage, i.e. after the removal of the etch mask 16 and after performing any cleaning processes, if required. Consequently, the contact openings 10a may be provided with similar lateral dimensions compared to conventional strategies, as previously described, while within the trenches 10b the out diffusion of the fluorine species from the sidewall 5s of the metallization system 5 is suppressed, or at least significantly reduced, due to the presence of the protection layer 15. It should be appreciated that the sidewall 5s is formed by sidewalls of each of the plurality of metallization layers 5a to 5f of the metallization system 5, while in other cases the trench 10b may not necessarily extend down to the substrate 4 but may terminate at any appropriate depth within the metallization system 5 if a corresponding mechanical decoupling of the chip 2a from the scribe lane 3 obtained by the specific depth of the trench 10b is considered appropriate.

Moreover, the remaining portions of the protection layer 15 formed above the passivation layer 10 may not unduly affect the further processing since any appropriate thickness may be selected in accordance with overall device requirements. Thus, the device 1 as illustrated in FIG. 9 may be considered as being formed on the basis of the same design rules and electrical specifications compared to the conventional devices, as previously described with FIGS. 1 to 4, wherein however the protection layer 15 may provide for superior surface conditions in the contact pads 8, thereby contributing to superior contact characteristics.

Figure 10:
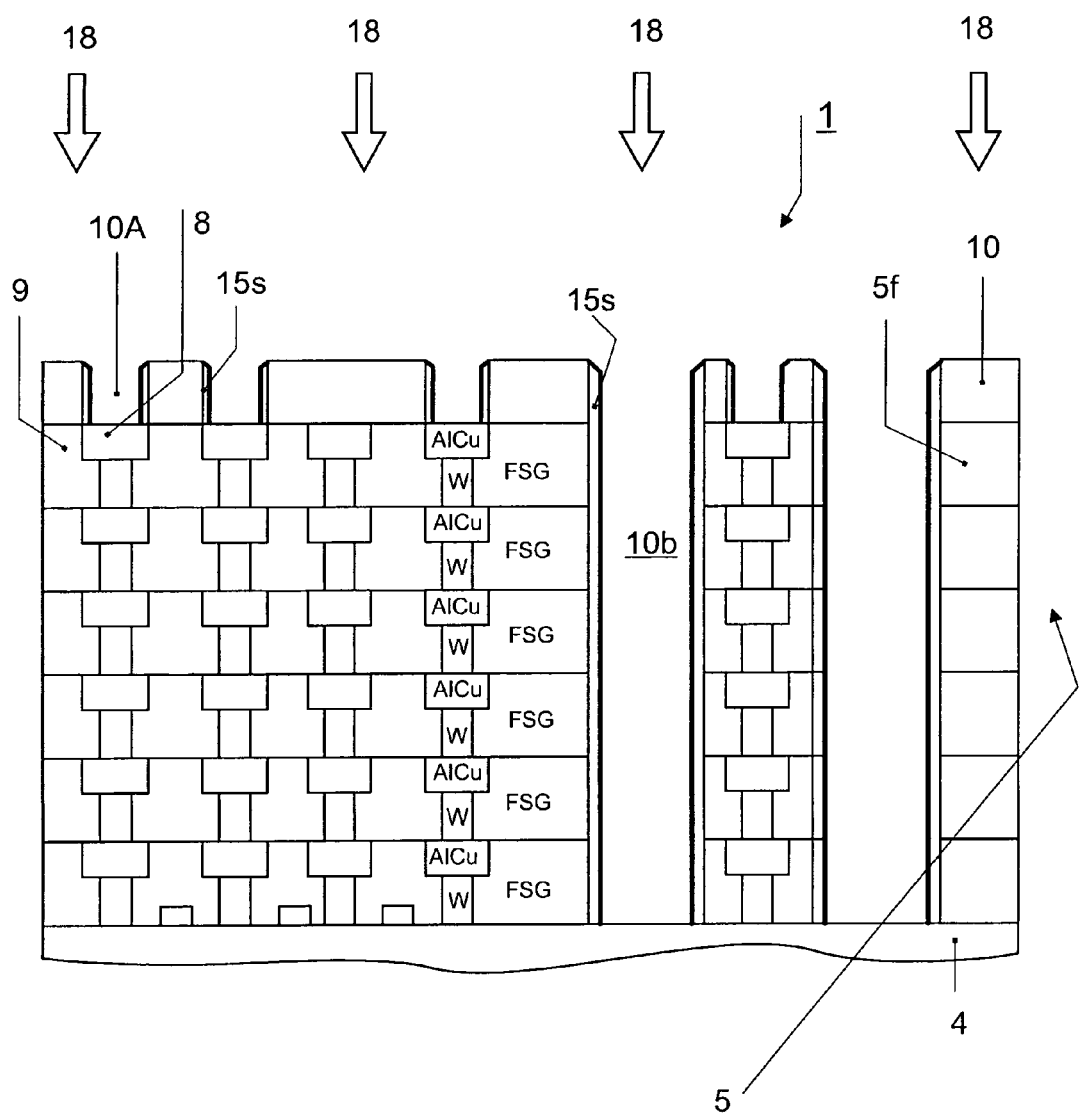
FIG. 10 schematically illustrates a cross-sectional view of the semiconductor device according to another illustrative embodiment in which "sidewall spacers" are formed in a trench in the scribe lane.

FIG. 10 schematically illustrates the semiconductor device 1 according to further illustrative embodiments in which, starting from the configuration as illustrated in FIG. 6, the device 1 is exposed to an anisotropic etch ambient 18 without providing an etch mask. The anisotropic etch process 18 may be performed on the basis of any appropriate directional etch technique, such as plasma assisted etch processes using appropriate etch chemistries, such as fluorine-based etch chemistries and the like, while in other cases sputter etch techniques may be applied. Consequently, during the etch process 18 material of the protection layer 15 is preferably removed from horizontal device areas and also from the contact pads 8, while critical sidewall portions, such as the sidewall 5s, may remain covered by portions of the protection layer 15, also indicated as portions or sidewall spacers 15s. It should be appreciated that the corresponding sidewall spacers 15s may also be formed within the contact openings 10a, which may contribute to superior confinement of the dielectric material 9 adjacent to the contact pads 8. Consequently, thereafter the further processing can be continued by applying additional cleaning processes for removing contaminants, such as fluorine species and the like, wherein the spacers 15s in the contact openings 10a may provide for the integrity of the material 9 in the final metallization layer 5f. Consequently, superior contact characteristics are obtained without requiring an additional lithography process.

Figure 11:
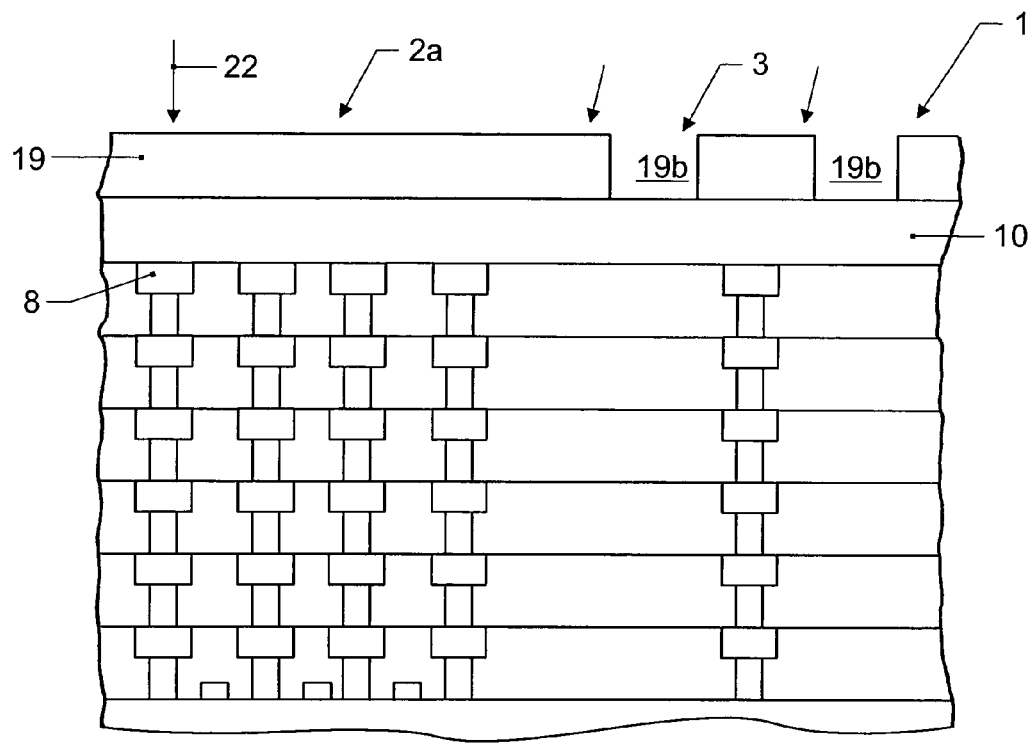
FIGS. 11 to 14 schematically illustrate cross-sectional views of the semiconductor device in which a trench in the scribe lane is formed and covered by a protection layer prior to exposing the contact pads.

FIG. 11 schematically illustrates the semiconductor device 1 according to a further illustrative embodiment in which an etch mask 19, such as a resist mask, is formed on or above the passivation layer 10 and comprising openings 19b in order to define the lateral size and position of the trenches 10b still to be formed in the scribe lane 3. For this purpose an appropriate lithography mask in combination with well-established lithography techniques are applied. Thereafter, an etch process 22, for instance on the basis of similar etch recipes as previously explained with reference to the trenches 10b, is applied in the presence of the etch mask 19.

Figure 12:
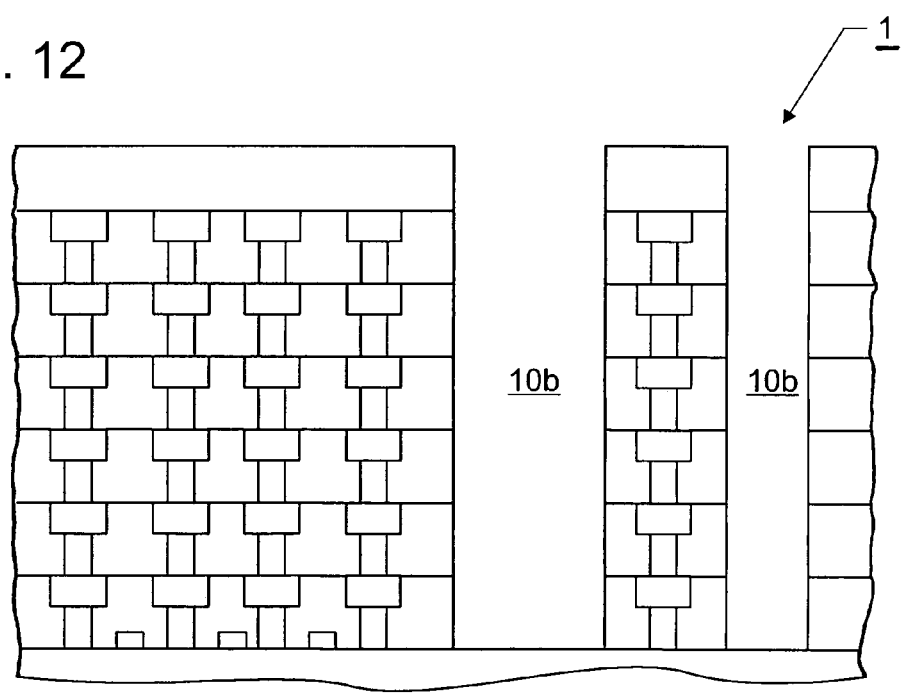

FIG. 12 schematically illustrates the semiconductor device 1 with the trenches 10b and after removal of the etch mask 19, which may be accomplished on the basis of any well-established resist removal techniques.

Figure 13:
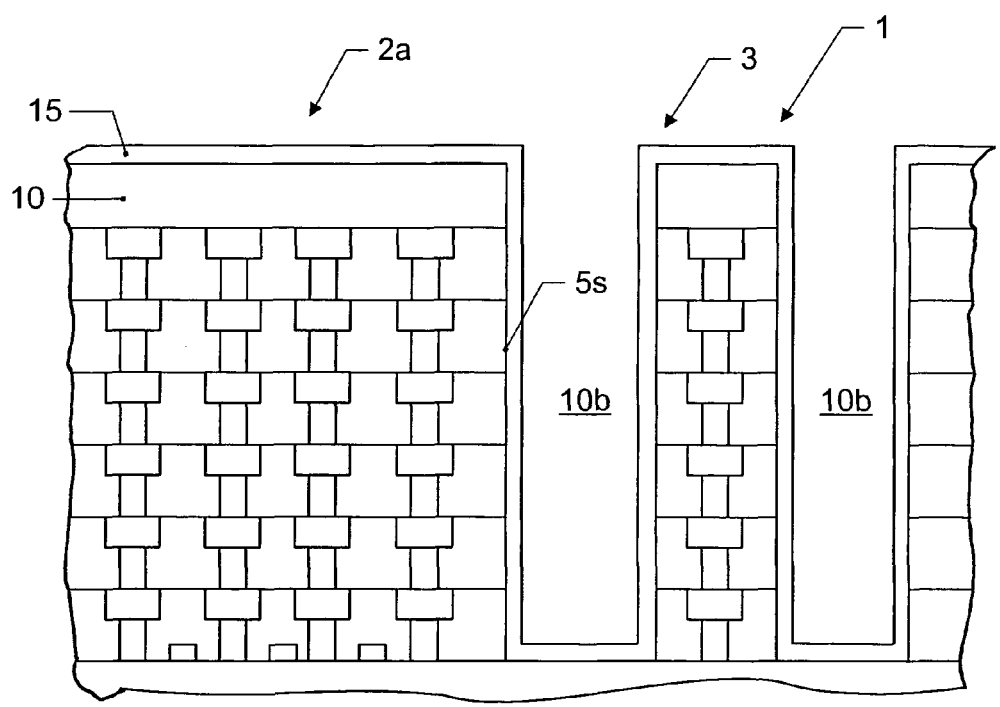

FIG. 13 schematically illustrates the semiconductor device 1 with the protection layer 15 formed on the passivation layer 10 and within the trenches 10b, thereby reliably covering the sidewall 5s.

Figure 14:
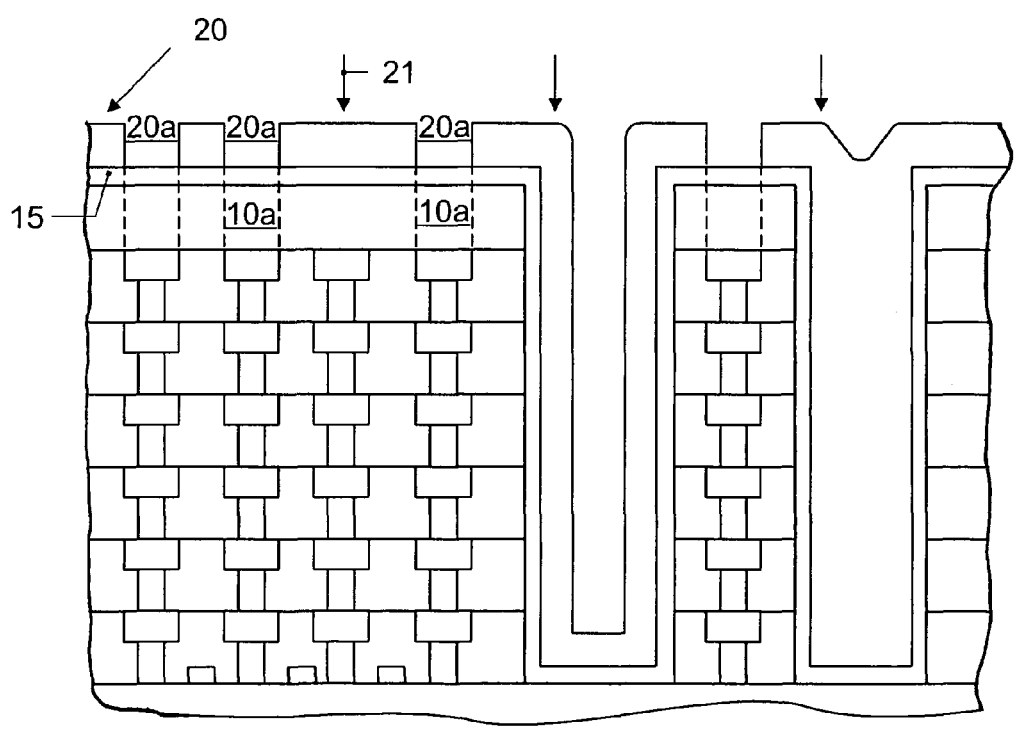

FIG. 14 schematically illustrates the semiconductor device 1 with a further etch mask 20, such as a resist mask, which comprises openings 20a that define the lateral size and position of the contact openings 10a still to be formed in the passivation layer 10. On the other hand, the etch mask 20 covers the portion of the protection layer 15 in the trenches 10b. Based on the etch mask 20, the device 1 is exposed to a further etch process 21 which may be performed on the basis of any appropriate etch chemistry in order to etch through the protection layer 15 and the passivation layer 10. In other illustrative embodiments the etch process 21 is designed so as to etch through the protection layer 15, which may subsequently be used as a hard mask material for patterning the passivation layer 10, thereby significantly relaxing any requirements imposed on the mask layer 20 since the etch mask 20 has merely to withstand an etch chemistry for etching through the moderately thin protection layer 15. In this case a subsequent etch process may be performed so as to etch the passivation layer 10*a* on the basis of the patterned protection layer 15. Consequently, the etch processes 22 (cf. FIG. 11) and 21 can appropriately be designed so as to form the trenches 10*b* and the contact openings 10*a*, respectively, so that no pronounced etch stop capabilities of the contact pads 8 need to be provided, thereby achieving an enhanced degree of flexibility in designing the overall process flow and selecting appropriate etch recipes, while also contributing to superior surface conditions of the contact pads 8.

Consequently, upon providing the protection layer 15 at least within the trenches 10*b* the further processing of the semiconductor device 1 is continued with a significantly reduced degree of out diffusion of unwanted species, such as fluorine species, irrespective of any queue time requirements during the further processing. That is, even very long storage times may not negatively affect the subsequent processes for contacting the contact pads by a bond wire.

Figure 15:
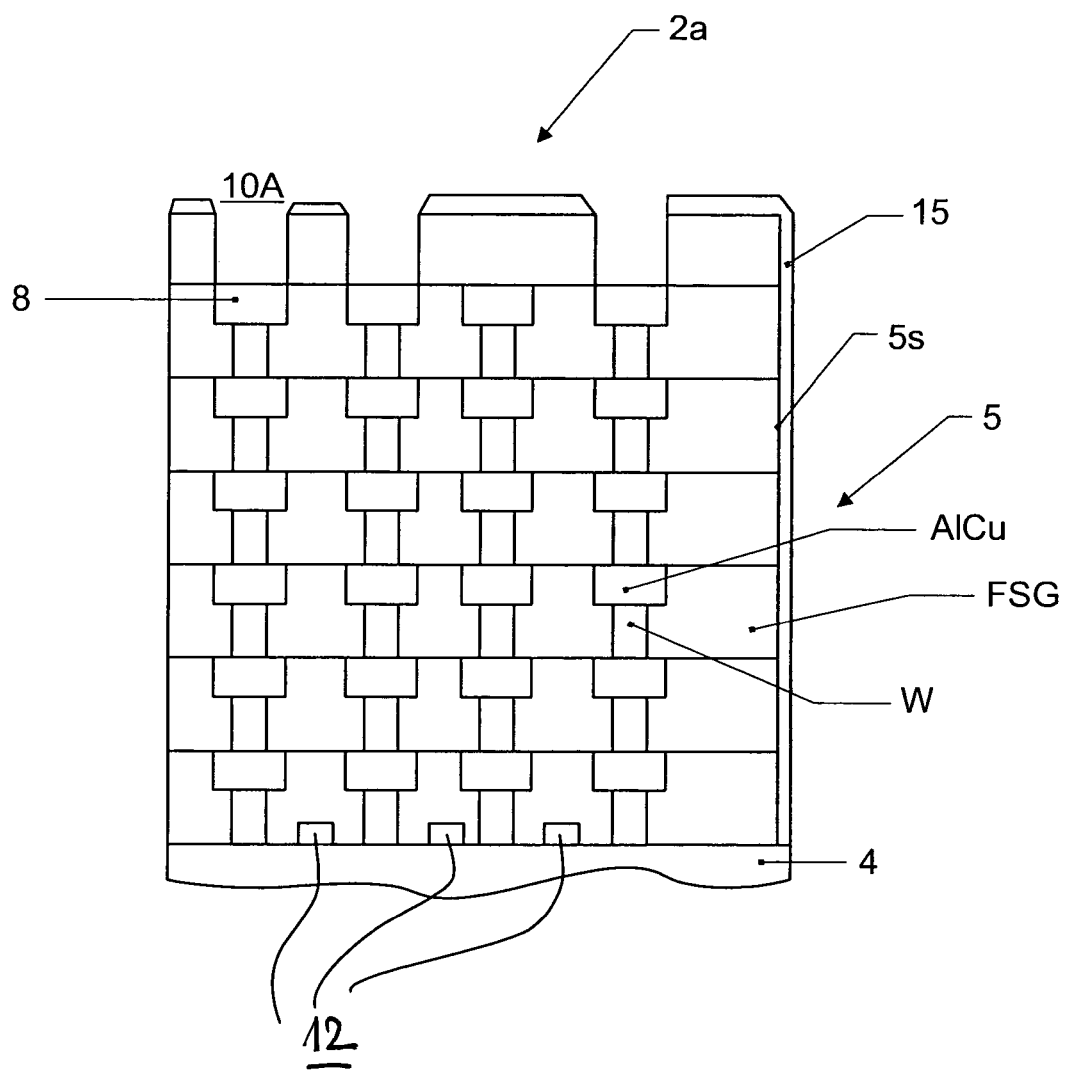
FIGS. 15 and 16 schematically illustrate cross-sectional views of a semiconductor chip after dicing a semiconductor wafer according to illustrative embodiments of the present invention.

FIG. 15 schematically illustrates the semiconductor device in a further advanced manufacturing stage, for instance after separating the semiconductor device 1 into individual semiconductor chips, such as the chip 2*a*, which thus comprises the contact openings 10*a* connecting to the contact pads 8 having the superior surface conditions due to the reduced out diffusion of the fluorine species from the sidewalls 5*s*. That is, due to the presence of the protection layer 15 at the periphery of the metallization system 5, i.e. at the sidewall 5*s*, an additional fluorine contamination of the contact pads 8 caused by the fluorine species in the dielectric material 9 has been suppressed, even if moderately long queue times may have occurred, for instance after exposing the contact pads 8 and finally dicing the corresponding semiconductor wafers in order to obtain the individual chips 2*a*. In this stage, the contact pads 8 may be contacted, for instance by bonding a bond wire thereto, which is accomplished on the basis of well-established bond techniques. Thus, the resulting intermetallic connection between the bond wire and the contact pad 8 has superior quality compared to conventional devices. It should be appreciated that, depending on the process strategy as described above, the protection layer 15 is also formed on the passivation layer 10, however without negatively affecting the bond process.

Figure 16:
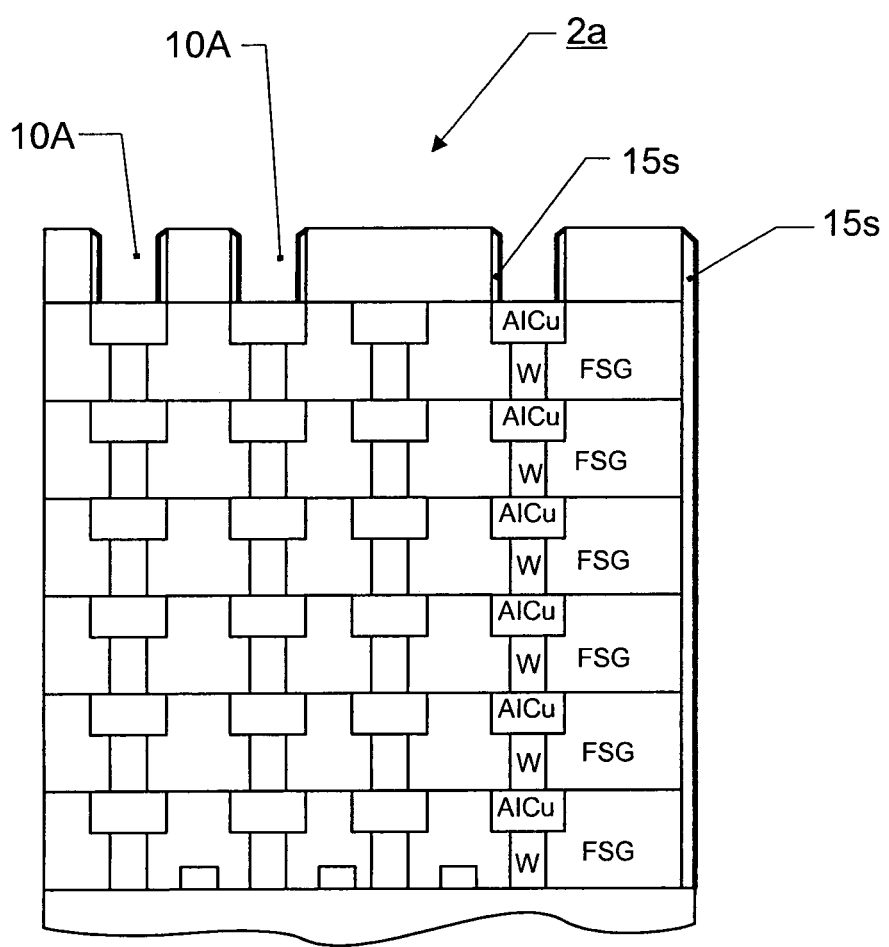

FIG. 16 schematically illustrates the semiconductor chip 2*a* in which the protection layer in the form of the portions or sidewall spacers 15*s* is exclusively formed within the contact openings 10*a* and on the sidewall 5*s*.

The invention claimed is:

1. A semiconductor device, comprising:
   a substrate;
   a main chip area including a metallization system formed on said substrate, said metallization system having a plurality of metallization layers, including a final metallization layer formed with a contact pad;
   a passivation layer formed above said final metallization layer and having a contact opening connecting to said contact pad;
   a protection layer formed on sidewalls of each of said plurality of metallization layers at a periphery of said main chip area and formed on sidewalls of said contact opening.

2. The semiconductor device according to claim 1, wherein said protection layer is formed above said passivation layer.

3. The semiconductor device according to claim 1, wherein said protection layer is comprised of at least one compound selected from the group consisting of silicon oxide, silicon nitride, and titanium nitride.

4. The semiconductor device according to claim 1, wherein said protection layer has a maximum thickness between 10 nm and 600 nm.

5. The semiconductor device according to claim 1, wherein said contact pad is a bond pad.

6. The semiconductor device according to claim 1, wherein said contact pad is formed with aluminum and copper.

7. A semiconductor device, comprising:
   a substrate;
   a main chip area including a metallization system formed on said substrate, said metallization system having a plurality of metallization layers, including a final metallization layer formed with a contact pad;
   a passivation layer formed above said final metallization layer and having a contact opening connecting to said contact pad; and
   a protection layer exclusively formed on said sidewalls of each of said plurality of metallization layers and said sidewalls of said contact opening.

* * * * *